United States Patent
Kim

(10) Patent No.: US 11,481,155 B2
(45) Date of Patent: Oct. 25, 2022

(54) CONTROLLER AND OPERATING METHOD THEREOF

(71) Applicant: SK hynix Inc., Gyeonggi-do (KR)

(72) Inventor: Jang Seob Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/150,641

(22) Filed: Jan. 15, 2021

(65) Prior Publication Data

US 2022/0011973 A1 Jan. 13, 2022

(30) Foreign Application Priority Data

Jul. 13, 2020 (KR) ........................ 10-2020-0086156

(51) Int. Cl.
*G06F 3/00* (2006.01)
*G06F 3/06* (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
CPC . G11C 29/021; G11C 29/028; G11C 11/5642; G11C 16/3459; G11C 11/5628; G11C 16/26; G11C 16/0483; G11C 2207/2254; G11C 16/3495; G11C 2211/5621; G11C 29/52; G11C 16/28; G11C 16/34; G11C 2029/4402; G11C 11/5671; G11C 16/10; G11C 16/30; G11C 2211/563; G11C 7/14; G11C 16/349; G11C 11/005; G11C 16/08; G11C 16/32; G11C 16/3404; G11C 16/3422; G11C 16/3436; G11C 2029/0409; G11C 2029/0411; G11C 2207/22; G11C 2207/2281; G11C 2207/229; G11C 2211/5641; G11C 29/42; G11C 7/04; G06N 20/00; G06N 3/08; G06F 11/142; G06F 2201/805; G06F 3/061;
(Continued)

(56) References Cited

U.S. PATENT DOCUMENTS

2019/0198097 A1* 6/2019 Kim .................. G11C 16/0483
2019/0295658 A1 9/2019 Amaki et al.

FOREIGN PATENT DOCUMENTS

KR 10-2017-0073794 6/2017

* cited by examiner

*Primary Examiner* — Thong Q Le
(74) *Attorney, Agent, or Firm* — IP & T Group LLP

(57) ABSTRACT

A controller for controlling a memory device comprising a plurality of multi-level cell memory blocks, the controller includes: a processor suitable for controlling the memory device to perform a read operation on a target logical page using some of the plurality of read voltages in a selected read voltage set; and an error correction code (ECC) component suitable for determining whether the read operation is successful, by performing error detection and correction on data generated in the read operation and output from the memory device, wherein, when the read operation is determined to be successful, the processor updates the selected read voltage set with the read voltages used in the read operation when it is successful and estimated values of unused read voltages of the selected read voltage set, the estimated values being determined based on the used read voltages.

20 Claims, 7 Drawing Sheets

(51) Int. Cl.
*G06N 20/00* (2019.01)
*G11C 16/26* (2006.01)
*G06F 11/10* (2006.01)
*G11C 16/04* (2006.01)
*G11C 11/56* (2006.01)

(52) U.S. Cl.
CPC ......... *G06F 11/1068* (2013.01); *G06N 20/00* (2019.01); *G11C 11/5671* (2013.01); *G11C 16/0483* (2013.01); *G11C 16/26* (2013.01)

(58) Field of Classification Search
CPC ...... G06F 3/0619; G06F 3/065; G06F 3/0688; G06F 11/073; G06F 3/0604; G06F 3/0659; G06F 3/0679; G06F 11/1068; G06F 11/0757; G06F 11/0793; G06F 11/10; G06F 11/1048; G06F 11/076; G06F 11/1072; G06F 11/108; G06F 11/3055
See application file for complete search history.

|  | $R_1$ | $R_2$ | $R_3$ | $R_4$ | $R_5$ | $R_6$ | $R_7$ |
|---|---|---|---|---|---|---|---|
| BLOCK1 | R11 | R12 | R13 | R14 | R15 | R16 | R17 |
| BLOCK2 | R21 | R22 | R23 | R24 | R25 | R26 | R27 |
| ... | ... | ... | ... | ... | ... | ... | ... |

CONTROLLER AND OPERATING METHOD THEREOF

CROSS-REFERENCE TO RELATED APPLICATION

This application claims priority under 35 U.S.C. § 119 to Korean Patent Application No. 10-2020-0086156, filed on Jul. 13, 2020, which is incorporated herein by reference in its entirety.

BACKGROUND

1. Field

Various embodiments relate to a controller controlling a memory device.

2. Discussion of the Related Art

The computer environment paradigm has been transitioning to ubiquitous computing, which enables computing systems to be used anytime, anywhere. As a result, use of portable electronic devices such as mobile phones, digital cameras, and laptop computers has rapidly increased. These portable electronic devices generally use a memory system having one or more memory devices for storing data. A memory system may be used as a main memory device or an auxiliary memory device of a portable electronic device.

Since they have no moving parts, memory systems provide advantages such as excellent stability and durability, high information access speed, and low power consumption. Examples of memory systems having such advantages include universal serial bus (USB) memory devices, memory cards having various interfaces, and solid state drives (SSDs).

SUMMARY

Various embodiments are directed to a controller capable of estimating values of unused read voltages of a read voltage set and updating the read voltage set with the estimated values although a read operation is performed using values of some read voltages of the read voltage set, and an operating method thereof.

In accordance with an embodiment, a controller for controlling a memory device comprising a plurality of multi-level cell memory blocks, the controller includes: a memory suitable for storing a plurality of read voltage sets, each having a plurality of read voltages for reading the multi-level cell memory blocks; a processor suitable for controlling the memory device to perform a read operation on a target logical page using some of the plurality of read voltages in a selected read voltage set of the read voltage sets; and an error correction code (ECC) component suitable for determining whether the read operation is successful, by performing error detection and correction on data generated in the read operation and output from the memory device, wherein, when the read operation is determined to be successful, the processor updates the selected read voltage set with the read voltages used in the read operation when it is successful and estimated values of unused read voltages of the selected read voltage set, the estimated values being determined based on the used read voltages.

In accordance with an embodiment, an operating method of a controller controlling a memory device comprising a plurality of multi-level cell memory blocks, the operating method includes: controlling the memory device to perform a read operation on a target logical page using some of a plurality of read voltages in a selected read voltage set of a plurality of read voltage sets stored in a memory of the controller, each of the read voltage sets having multiple read voltages for reading the multi-level cell memory blocks; determining whether the read operation is successful, by performing error detection and correction on data output from the memory device by the read operation; and updating the selected read voltage set with the read voltages used in the read operation when it is successful and estimated values of unused read voltages of the selected read voltage set, the estimated values being determined based on the used read voltages.

In accordance with an embodiment, a memory system includes: a memory device including a plurality of memory blocks; and a controller configured to: control the memory device to perform a read operation on a target logical page using select read voltages in a target read voltage set including the select read voltages and remaining read voltages; determine whether the read operation is successful; when it is determined that the read operation was successful, change a value of each of the remaining read voltages, based on a difference between previous and current values of each of the select read voltages; and update the target read voltage set such that the select read voltages have the current values and the remaining read voltages have changed values.

BRIEF DESCRIPTION OF THE DRAWINGS

FIG. 4 illustrates an example of a read voltage table.

DETAILED DESCRIPTION

Figure 1:
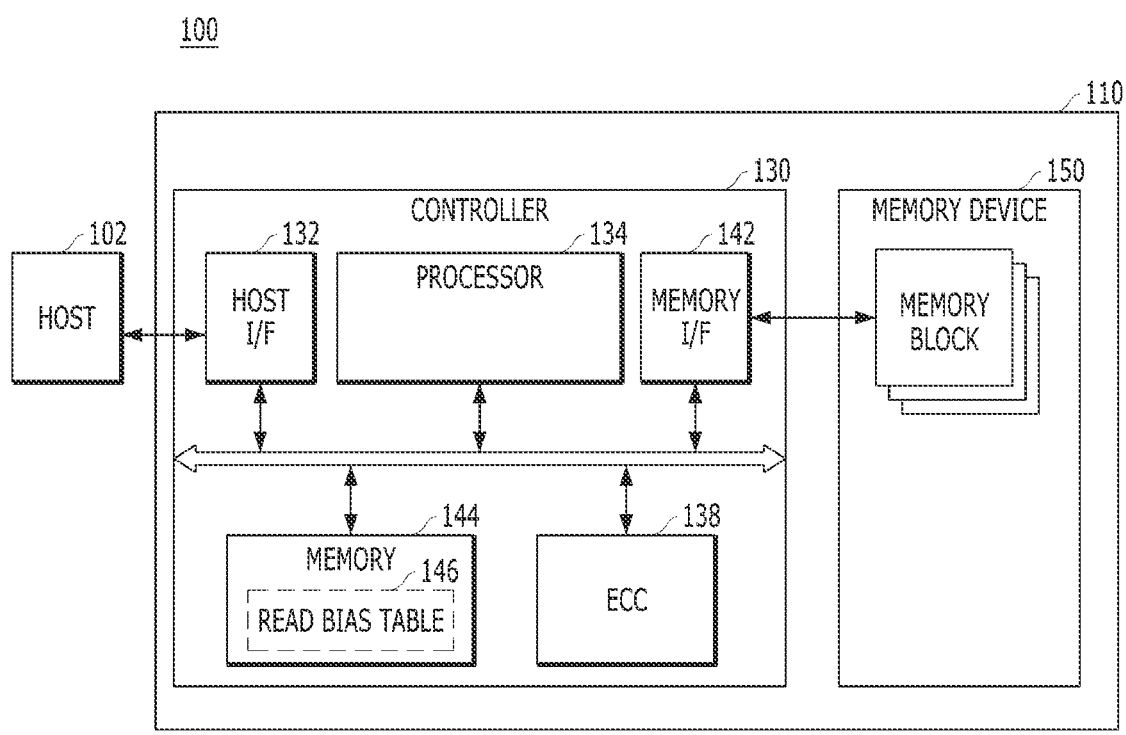
FIG. 1 is a diagram schematically illustrating an example of a data processing system including a memory system according to an embodiment.

Various embodiments are described below in detail with reference to the accompanying drawings. The present invention may, however, be embodied in different forms and thus should not be construed as limited to the embodiments set forth herein. Rather, these embodiments are provided so that this disclosure is thorough and complete, and fully conveys the scope of the present disclosure to those skilled in the art. Throughout the disclosure, like reference numerals refer to like parts throughout the various figures and embodiments of the present disclosure. Throughout the specification, reference to "an embodiment," "another embodiment" or the like is not necessarily to only one embodiment, and different references to any such phrase are not necessarily to the same embodiment(s). The term "embodiments" when used herein does not necessarily refer to all embodiments.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include any of various portable electronic devices such as a mobile phone, MP3 player and/or laptop computer, or any of various non-portable electronic devices such as a desktop computer, a game machine, a television (TV), and/or a projector.

The host 102 may include at least one operating system (OS), which may manage and control overall function and operation of the host 102, and provide operation between the host 102 and a user using the data processing system 100 or the memory system 110. The OS may support functions and operations corresponding to the use purpose and usage of a user. For example, the OS may be divided into a general OS and a mobile OS, depending on the mobility of the host 102. The general OS may be divided into a personal OS and an enterprise OS, depending on the environment of a user.

The memory system 110 may operate to store data for the host 102 in response to a request of the host 102. Non-limiting examples of the memory system 110 include a solid state drive (SSD), a multi-media card (MMC), a secure digital (SD) card, a universal serial bus (USB) device, a universal flash storage (UFS) device, a compact flash (CF) card, a smart media card (SMC), a personal computer memory card international association (PCMCIA) card and/or a memory stick. The MMC may include an embedded MMC (eMMC), reduced size MMC (RS-MMC) and micro-MMC. The SD card may include a mini-SD card and micro-SD card.

The memory system 110 may be embodied by any of various types of storage devices. Examples of such storage devices include, but are not limited to, volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM or ReRAM) and a flash memory. The flash memory may have a 3-dimensional (3D) stack structure.

The memory system 110 may include a controller 130 and a memory device 150. The memory device 150 may store data for the host 102, and the controller 130 may control data storage into the memory device 150.

The controller 130 and the memory device 150 may be integrated into a single semiconductor device. For example, the controller 130 and the memory device 150 may be integrated as one semiconductor device to constitute a solid state drive (SSD). When the memory system 110 is used as an SSD, the operating speed of the host 102 connected to the memory system 110 can be improved. In another embodiment, the controller 130 and the memory device 150 may be integrated as one semiconductor device to constitute a memory card, such as a personal computer memory card international association (PCMCIA) card, a compact flash (CF) card, a smart media (SM) card, a memory stick, a multimedia card (MMC) including reduced size MMC (RS-MMC) and micro-MMC, a secure digital (SD) card including mini-SD card, micro-SD card and SDHC card, or a universal flash storage (UFS) device.

Non-limiting application examples of the memory system 110 include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a program operation, and provide data stored therein to the host 102 through a read operation.

The memory device 150 may include a flash memory device. The flash memory device may store data in a memory cell array including memory cell transistors. The flash memory device may have a hierarchical structure of memory die(s), plane(s), memory block(s) and page(s). One memory die may receive one command at a time. The flash memory device may include a plurality of memory dies. One memory die may include a plurality of planes, which may process commands received by the memory die in parallel. Each of the planes may include a plurality of memory blocks. A memory block may correspond to the minimum unit of an erase operation. Each memory block may include a plurality of pages. A page may correspond to the minimum unit of a write operation.

The structure of the memory device 150 is more specifically described with reference to FIG. 2.

Figure 2:
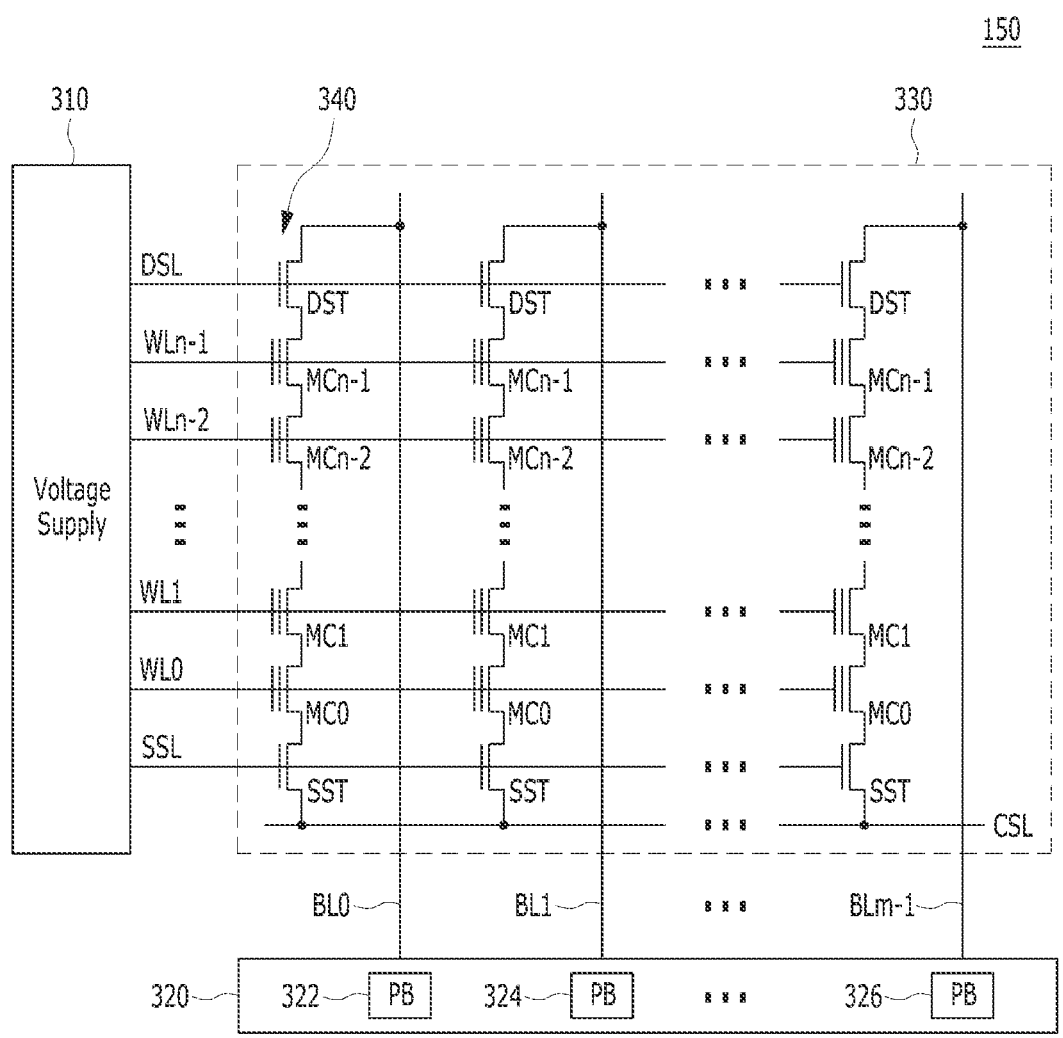
FIG. 2 is a circuit diagram illustrating an exemplary configuration of a memory cell array of a memory device.

FIG. 2 is a circuit diagram illustrating an exemplary configuration of a memory cell array of the memory device 150.

Referring to FIG. 2, a memory block 330 is representative of any of the plurality of memory blocks in the memory device 150 of the memory system 110. The memory block 330 may include a plurality of cell strings 340 coupled to a plurality of corresponding bit lines BL0 to BLm−1. The cell string 340 of each column may include one or more drain select transistors DST and one or more source select transistors SST. Between the drain and source select transistors DST and SST, a plurality of memory cells or memory cell transistors MC0 to MCn−1 may be coupled in series. In an embodiment, each of the memory cells MC0 to MCn−1 may be embodied by a multi-level cell (MLC) capable of storing data information of a plurality of bits. Each of the cell strings 340 may be electrically coupled to a corresponding bit line among the plurality of bit lines BL0 to BLm−1. For example, as illustrated in FIG. 2, the first cell string is coupled to the first bit line BL0, and the last cell string is coupled to the last bit line BLm−1. In FIG. 2, 'DSL' denotes a drain select line, 'SSL' denotes a source select line, and 'CSL' denotes a common source line.

Although FIG. 2 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which provides word line voltages including a program voltage, a read voltage and a pass voltage to supply to the word lines according to an operation mode. The voltage generation operation of the voltage supply 310 may be controlled by a control circuit (not illustrated). Under the control of the control circuit, the voltage supply 310 may select one of the memory blocks (or sectors) of the memory cell array, select one of the word lines of the selected memory block, and provide the word line voltages to the selected word line and the unselected word lines.

The memory device 150 may include a read and write (read/write) circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers (PBs) 322 to 326 respectively corresponding to columns (or bit lines) or column pairs (or bit line pairs). Each of the page buffers 322 to 326 may include a plurality of latches (not illustrated).

The memory device 150 may be embodied by a two-dimensional (2D) or three-dimensional (3D) memory device. Particularly, the memory device 150 may be embodied by a nonvolatile memory device having a 3D stack structure. When the memory device 150 has a 3D structure, the memory device 150 may include a plurality of memory blocks.

Each memory block 330 in the memory device 150 may include a plurality of NAND strings NS that extend in a second direction, and a plurality of NAND strings NS that extend in a first direction and a third direction, where the first, second and third directions may be mutually orthogonal. Each of the NAND strings NS may be coupled to a bit line BL, at least one drain select line DSL, at least one source select line SSL, a plurality of word lines WL, at least one dummy word line DWL (not shown), and a common source line CSL. Each of the NAND strings NS may include a plurality of transistor structures.

In short, each memory block 330 of the memory device 150 may be coupled to a plurality of bit lines BL, a plurality of drain select lines DSL, a plurality of source select lines SSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to configure a plurality of transistors in one NAND string NS. Also, a drain select transistor DST of each NAND string NS may be coupled to a corresponding bit line BL, and a source select transistor SST of each NAND string NS may be coupled to a common source line CSL. Memory cells MC may be provided between the drain select transistor DST and the source select transistor SST of each NAND string NS. In other words, a plurality of memory cells may be disposed in each memory block 330 of the memory device 150.

The memory device 150 may include multi-level cells each capable of storing data having plural bits. For example, each multi-level cell may include a triple level cell (TLC) capable of storing data having three bits.

Threshold voltages of multiple memory cells in which the same data is programmed may form a threshold voltage distribution due to a difference in fine electrical characteristic between the memory cells.

Figure 3:
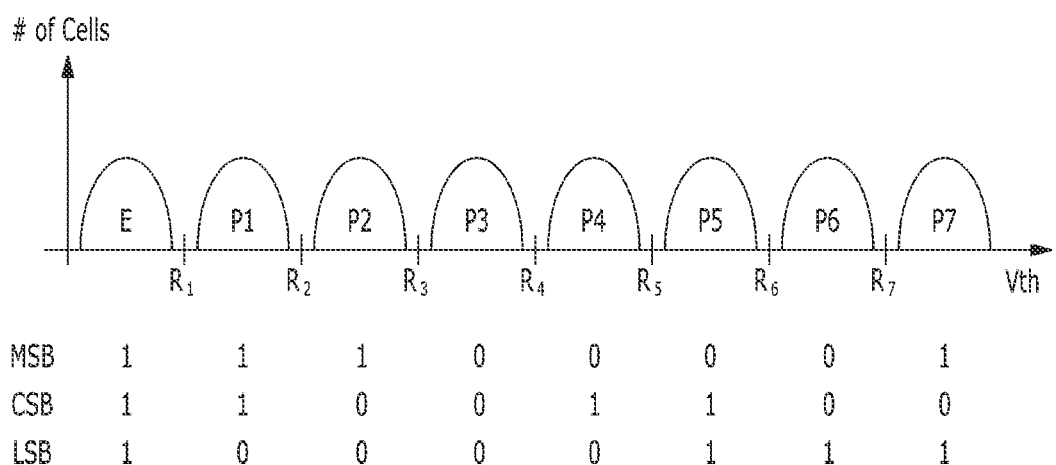
FIG. 3 is a diagram illustrating threshold voltage distributions of memory cells.

FIG. 3 is a diagram illustrating threshold voltage distributions of memory cells, for example, threshold voltage distributions of TLCs.

When a TLC is programmed, the TLC may have any one of seven program states P1 to P7 and an erase state E. The threshold voltage distributions of the respective states illustrated in FIG. 3 do not overlap and each may have a specific read voltage margin range.

The states of the TLCs may be mapped to different permutations of 3-bit data, respectively. For example, the erase state E may be mapped to data "111." Likewise, the seven program states P1 to P7 may be mapped to data "110", "100", "000", "010", "011", "001", and "101", respectively. Referring to FIG. 3, the most significant bit of the 3-bit data may be denoted as the MSB, the central significant bit of the 3-bit data may be denoted as a CSB, and the least significant bit of the 3-bit data may be denoted as the LSB.

The memory device 150 may program data in a unit of one word line. A group of memory cells coupled to one word line may be denoted as a physical page. Each of memory cell in one physical page may store 3-bit data. Accordingly, one physical page may include an MSB page, a CSB page, and a LSB page, that is, three logical pages.

The memory device 150 may apply a plurality of read voltages to a word line, to which memory cells are coupled, in order to read data indicated by the memory cells. For example, the memory device 150 may apply seven read voltages R1 to R7 to a word line in order to read data in TLCs. Multiple read voltages applied by the memory device 150 in order to read data is denoted as a read voltage set.

After memory cells are programmed, threshold voltage distributions of the memory cells may change over time. For example, when a voltage is applied to word lines around a programmed memory cell, a threshold voltage distribution may change because the threshold voltage of the programmed memory cell increases. For another example, if a programmed memory cell is left alone, a threshold voltage distribution of the programmed memory cell may change because charges trapped in the programmed memory cell are lost.

In order for the memory device 150 to accurately read data, read voltages to be applied to a word line need to be properly selected based on a threshold voltage distribution of memory cells. The controller 130 capable of selecting a plurality of read voltages is described below.

Referring back to FIG. 1, the controller 130 may control the memory device 150 in response to a request from the host 102. For example, the controller 130 may provide data read from the memory device 150 to the host 102, and store data provided from the host 102 into the memory device 150. To this end, the controller 130 may control read, program and erase operations of the memory device 150.

The controller 130 may include a host interface (I/F) 132, a processor 134, an error correction code (ECC) component 138, a memory I/F 142 such as a NAND flash controller (NFC), and a memory 144, all operatively coupled via an internal bus.

The host I/F 132 may be configured to process a command and data of the host 102. The host I/F 132 may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE).

The host I/F 132 may be driven through firmware referred to as a host interface layer (HIL) in order to exchange data with the host 102.

The memory I/F 142 may serve as a memory/storage interface for interfacing the controller 130 and the memory device 150 such that the controller 130 controls the memory device 150 in response to a request from the host 102. When the memory device 150 is a flash memory, such as a NAND flash memory, the memory I/F 142 may generate a control signal for the memory device 150 and process data to be provided to the memory device 150 under the control of the processor 134. The memory I/F 142 may work as an interface (e.g., a NAND flash interface) for processing a command and data between the controller 130 and the memory device 150. Specifically, the memory I/F 142 may support data transfer between the controller 130 and the memory device 150.

The memory I/F 142 may be driven through firmware referred to as a flash interface layer (FIL) in order to exchange data with the memory device 150.

The ECC component 138 may detect and correct error(s) contained in the data read from the memory device 150. In other words, the ECC component 138 may perform an error correction decoding process on the data read from the memory device 150 through an ECC value used during an ECC encoding process. According to a result of the error correction decoding process, the ECC component 138 may output a signal, for example, an error correction success/fail signal. When the number of error bits is more than a threshold value of correctable error bits, the ECC component 138 may not correct the error bits, and may instead output an error correction fail signal.

The ECC component 138 may include an ECC encoder and an ECC decoder. The ECC encoder may generate data with a parity bit by performing error correction encoding on data to be programmed into the memory device 150, and the data with the parity bit may be stored in the memory device 150. The ECC decoder may detect and correct errors in data read from the memory device 150 when reading the data stored in the memory device 150.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited to any specific structure. The ECC component 138 may include any and all circuits, modules, systems or devices for suitable error correction.

The processor 134 may control overall operation of the memory system 110. The processor 134 may drive firmware to control overall operation of the memory system 110. The firmware may be referred to as a flash translation layer (FTL). Also, the processor 134 may be realized as a microprocessor or a central processing unit (CPU).

The processor 134 may drive the FTL and perform a foreground operation corresponding to a request received from the host 102. For example, the processor 134 may control a write operation of the memory device 150 in response to a write request from the host 102 and control a read operation of the memory device 150 in response to a read request from the host 102.

Also, the controller 130 may perform a background operation on the memory device 150 through the processor 134. For example, the background operation may include a garbage collection (GC) operation, a wear-leveling (WL) operation, a map flush operation, a bad block management operation, or a media scan operation.

A read operation of the memory device 150 may be performed as a foreground operation or a background operation. As described with reference to FIG. 3, in order to accurately read data from the memory device 150, the processor 134 needs to determine a read voltage to be applied to the memory device 150 based on threshold voltages of memory cells. For example, the processor 134 may store, in the controller 130, a read voltage used in a previous read operation in which the data read was successfully corrected by the ECC component 138, and may perform a read operation using the stored read voltage when performing a current read operation. The stored read voltage may be denoted as a history read voltage.

The memory 144 may serve as a working memory of the memory system 110 and the controller 130, and store data for driving the memory system 110 and the controller 130. The controller 130 may control the memory device 150 to perform read, program and erase operations in response to a request from the host 102. The controller 130 may provide data read from the memory device 150 to the host 102, may store data provided from the host 102 into the memory device 150. The memory 144 may store data for the controller 130 and the memory device 150 to perform these operations.

The memory 144 may be embodied as a volatile memory. For example, the memory 144 may be embodied as a static random access memory (SRAM) or a dynamic random access memory (DRAM). The memory 144 may be disposed within or externally to the controller 130. FIG. 1 exemplifies the memory 144 disposed within the controller 130. In another embodiment, the memory 144 may be an external volatile memory having a memory interface transferring data between the memory 144 and the controller 130.

The memory 144 may store a read voltage table 146 (READ BIAS TABLE) that includes data for the controller 130 and the memory device 150 to perform an operation. For example, the read voltage table 146 may store history read voltages.

FIG. 4 illustrates an example of the read voltage table 146.

In the example of FIG. 4, the read voltage table 146 may store a history read voltage set for each memory block, that is, multiple history read voltages for each memory block. Memory blocks may be TLC memory blocks. The memory device 150 may perform a read operation using multiple read voltages, e.g., seven read voltages R1 to R7.

Seven history read voltages R11 to R17 of a first memory block BLOCK1 are illustrated in FIG. 4. That is, R11 to R17 may be read voltages that were used by the memory device 150 in a recently-performed and successfully-completed read operation on the first memory block BLOCK1. Likewise, history read voltages R21 to R27 for a second memory block BLOCK2 are also illustrated. Each of R11 to R17 and R21 to R27 is a fixed voltage. For the purpose of cross-figure comparison, each of R11 to R17 and R21 to R27 in FIG. 4 corresponds to R1 to R7 in FIG. 3.

Not all read voltages in a read voltage set are necessarily used when data is read from a memory block. In the example of FIG. 3, although the memory device 150 applies only the first and fifth read voltages R1 and R5 to a word line, threshold voltage states having the LSB of "0" and threshold voltage states having the LSB of "1" may be distinguished. Accordingly, although the memory device 150 applies only the first and fifth read voltages R1 and R5 to the word line, data may be read from the LSB page associated with the word line.

In order for the processor 134 to obtain data from the memory device 150 that has a high probability of being successfully error corrected, the read voltage table 146 may have a history read voltage set based on the latest threshold voltage distribution for each memory block. If the processor 134 updates only values of some read voltages that belong to a history read voltage set of the read voltage table 146 and that were used in a recent read operation, the read voltage table 146 cannot have a history read voltage set based on the latest threshold voltage distribution.

For example, if the memory device 150 reads the LSB page of a memory block by applying the first and fifth read voltages R1 and R5 and then the processor 134 updates only the first and fifth read voltages R1 and R5 in the history read voltage set of the corresponding memory block, the second, third, fourth, sixth and seventh read voltages R2, R3, R4, R6, and R7 may still be from the past threshold voltage distribution. If the read voltage table 146 does have a history read voltage set based on the latest threshold voltage distribution, the processor 134 may not obtain accurate data from the memory device 150.

According to embodiments, if the memory device 150 has successfully completed a read operation using only some read voltages in a read voltage set, the processor 134 may estimate values of the remaining read voltages based on the read voltages used in the successfully completed read operation, and may update the read voltage table 146 with the successfully used read voltages and the estimated read voltages.

According to such embodiments, although the memory device 150 has performed a read operation on a memory block using only some read voltages, the processor 134 may update all read voltages in the read voltage set of the corresponding memory block by incorporating the latest threshold voltage distribution of memory cells. By using the read voltage set into which the latest threshold voltage distribution of memory cells has been incorporated, the probability of success in a subsequent read operation for the corresponding memory block increases. Accordingly, performance and reliability of the memory system 110 may be improved.

Figure 5:
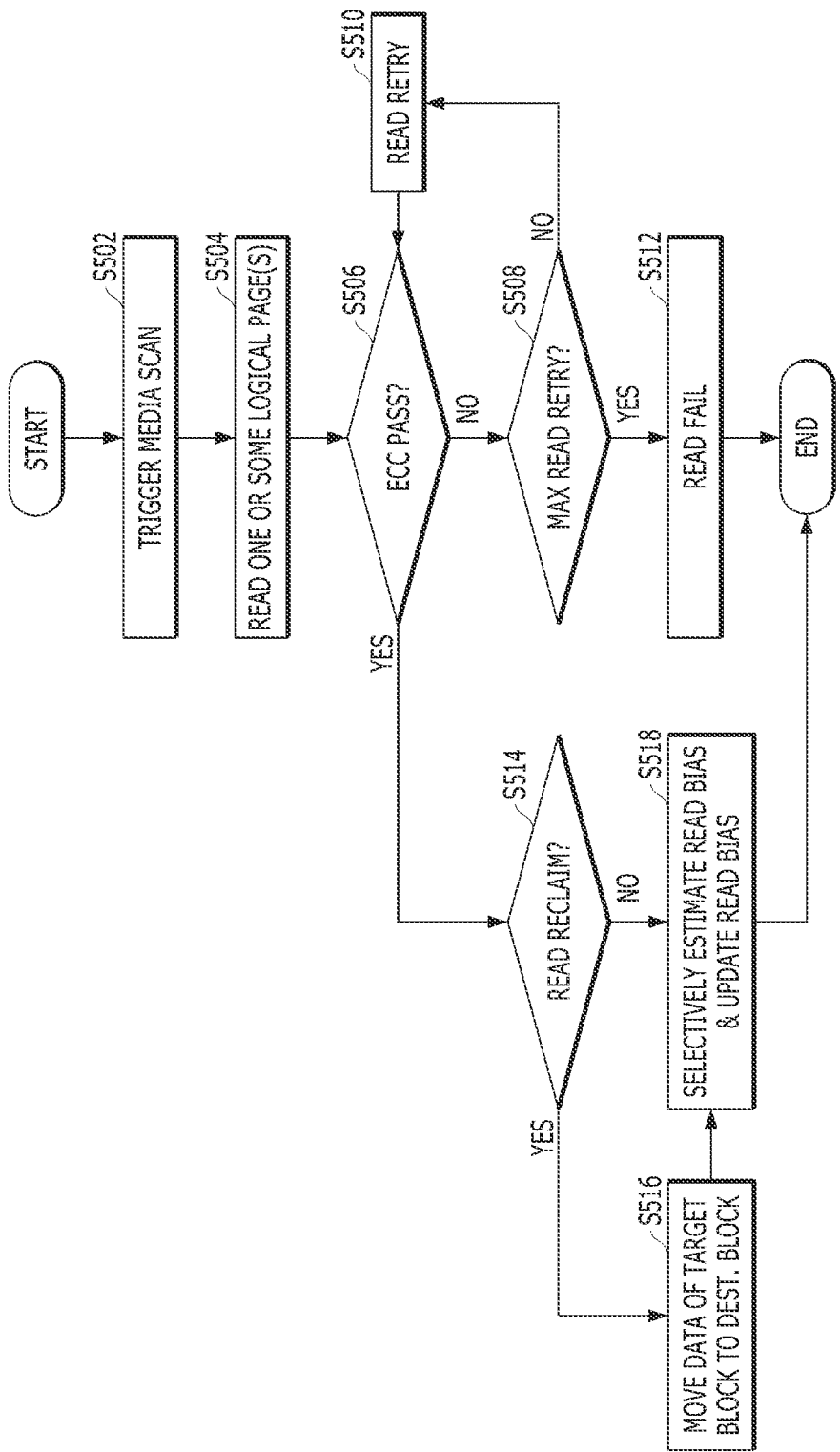
FIG. 5 is a flowchart illustrating a media scan operation in the form of a read operation using only some read voltages of a read voltage set, according to an embodiment.

FIG. 5 is a flowchart illustrating a media scan operation including a read operation using only some read voltages of a read voltage set, according to embodiments.

Data stored in a memory cell may be damaged due to a change in a threshold voltage distribution of memory cells into which data has been programmed. The processor 134 may perform a read reclaim operation in order to prevent an error at a level, which cannot be corrected by the ECC component 138, from occurring in data. The read reclaim operation denotes an operation of correcting an error of data when the error having a predetermined level or more occurs in the data obtained from the memory device 150 and storing the corrected data in the memory device 150.

The processor 134 may perform a media scan operation in order to prevent a timely read reclaim operation from being not performed on a memory block that has not been accessed for a long time and to prevent data from being damaged. The media scan operation denotes an operation of periodically reading, by the processor 134, data from memory blocks and performing a read reclaim operation when an error having a predetermined level or more occurs in the read data. A media scan operation according to an embodiment is specifically described with reference to FIG. 5.

At operation S502, the processor 134 may periodically trigger a media scan operation.

For example, the processor 134 may determine a media scan is triggered so that all of the memory blocks of the memory device 150 can be read in a determined time period. To that end, the processor 134 performs a media scan operation on respective subsets of all memory blocks in respective trigger cycles spanning the determined time period, such that all of the memory blocks of the memory device 150 may be read once in the determined time period. A memory block to be read in a currently triggered media scan operation is denoted as a target memory block.

At operation S504, the processor 134 may control the memory device 150 to read one or some logical pages in a target memory block.

For example, in order to prevent performance degradation attributable to the media scan operation, the processor 134 may control the memory device 150 to read vulnerable memory cells, among all memory cells, of the target memory block. Which memory cells of the memory blocks are considered vulnerable may be statistically determined in advance. Information indicating a vulnerable word line to which the vulnerable memory cells are coupled may be previously stored in the memory device 150.

Furthermore, the processor 134 may control the memory device 150 to read one or more logical pages, for example, only the LSB page, instead of controlling the memory device 150 to read all of logical pages associated with the vulnerable word line. When the memory device 150 reads only the LSB page, the memory device 150 may apply only the first and fifth read voltages R1 and R5 to the vulnerable word line. The read operation in the media scan operation is not an operation for obtaining data, but an operation for determining the reliability of data stored in a memory block. The processor 134 may determine the reliability of the data stored in the memory block, based on the results of reading only some logical pages (or even only one logical page) of the vulnerable word line, and may complete the media scan operation within a shorter time compared to a case where all of the logical pages are read.

The processor 134 may search the read voltage table 146 for history read voltages corresponding to the first and fifth read voltages R1 and R5 of the target memory block. Further, the processor 134 may control the memory device 150 to read the LSB page based on the retrieved history read voltages.

The example above in which the memory device 150 reads the LSB page at operation S504 is merely illustrative. In some implementations, the memory device 150 may read the CSB page or the MSB page. In the example of FIG. 3, when the memory device 150 reads only the CSB page in the media scan operation, the memory device 150 may apply only the second, fourth and sixth read voltages R2, R4, and R6 to the vulnerable word line. Furthermore, when the memory device 150 reads only the MSB page, the memory device 150 may apply only the third and seventh read voltages R3 and R7 to the vulnerable word line.

At operation S506, the ECC component 138 may perform error correction decoding on data obtained by the read operation at S504, and may determine whether the error correction decoding was successful.

The error correction decoding may include hard decision decoding and soft decision decoding. The ECC component 138 may perform hard decision decoding using data read by applying only the first and fifth read voltages R1 and R5.

When it is determined that the hard decision decoding fails, the processor 134 may obtain reliability information on the read data by reading the LSB page by applying soft read voltages, that is, voltages neighboring or adjacent to the first and fifth read voltages R1 and R5. The ECC component 138 may perform soft decision decoding using the reliability information.

When it is determined that the error correction decoding failed ("NO" at S506), at operation S508, the processor 134 may determine whether the memory device 150 has performed a maximum number of read retries.

When it is determined that the memory device 150 has not performed the maximum number of read retries ("NO" at S508), at operation S510, the processor 134 may control the memory device 150 to perform a read retry operation on the LSB page.

The processor 134 may perform the read retry operation using a read voltage not used in a previous read operation nor in a previous read retry operation for the LSB page.

As a first example, the read voltage table 146 may include a read retry table of read voltages. The processor 134 may control the memory device 150 to perform the read retry operation on the LSB page using the first and fifth read voltages R1 and R5 of the read voltage set in the read retry table.

As a second example, the processor 134 may determine an optimal read voltage set using a Gaussian modeling algorithm, or the like, and may control the memory device 150 to perform the read retry operation on the LSB page using the first and fifth read voltages R1 and R5 of the determined read voltage set.

When it is determined that the memory device 150 has performed the maximum number of read retries ("YES" at S508), at operation S512, the processor 134 may determine that the read operation for the LSB page has failed.

When it is determined that the error correction decoding was successful ("YES" at S506), at operation S514, the processor 134 may determine whether to perform a read reclaim operation on the target memory block.

For example, when the result at S506 is that the processor 134 has failed to decode the data using hard decision decoding, but soft decision decoding was successful, the processor 134 may determine at S514 to perform a read reclaim operation on the target memory block.

When the processor 134 determines to perform the read reclaim operation ("YES" at S514), at operation S516, the processor 134 may obtain data from the target memory block, may correct an error of the data using the ECC component 138, and may control the memory device 150 to store the error-corrected data in a destination block. Furthermore, the processor 134 may perform operation S518.

When the processor 134 determines not to perform the read reclaim operation ("NO" at S514), at operation S518, the processor 134 may selectively estimate the second, third, fourth, sixth and seventh read voltages R2, R3, R4, R6, and R7 based on the first and fifth read voltages R1 and R5, and may update the read voltages.

Figure 6:
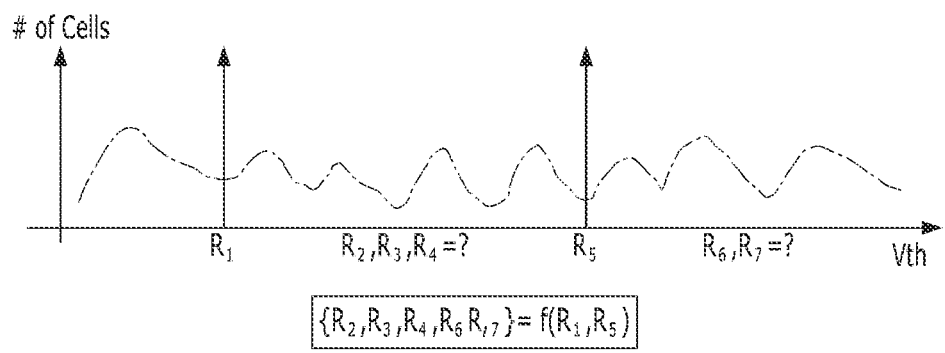
FIG. 6 is a diagram illustrating estimation of read voltages according to embodiments.

FIG. 6 is a diagram illustrating the estimation of read voltages according to embodiments.

In a graph illustrated in FIG. 6, the horizontal (i.e., x) axis indicates threshold voltages of memory cells, and the vertical (i.e., y) axis indicates the number of memory cells having corresponding threshold voltages. In the graph of FIG. 6, the curve (alternating long and short dashed lines) illustrates a threshold voltage distribution of the memory cells. The threshold voltage distribution in the graph of FIG. 6 may be a threshold voltage distribution that has changed from the ideal threshold voltage distribution in the graph of FIG. 3, due to read disturbance and leakage of charges from memory cells.

The processor 134 may determine read voltages by incorporating the latest threshold voltage distribution of memory cells so that the memory device 150 can accurately read data programmed into memory cells of a memory block. However, the processor 134 is not aware of the accurate current threshold voltage distribution of the memory cells. Accordingly, as described with reference to FIG. 4, the processor 134 may control a read operation of the memory device 150 using a history read voltage set determined based on the results of a recent read operation for the memory block.

A certain read operation, for example, a media scan operation for the memory block may be performed using only some read voltages of the read voltage set. When the read operation performed using some read voltages is successful, values of those read voltages may incorporate the latest threshold voltage distribution. FIG. 6 illustrates values of first and fifth read voltages R1 and R5 when the memory device 150 has successfully read the LSB page of a memory block using only the first and fifth read voltages R1 and R5.

The processor 134 may estimate the remaining read voltages, not used in the read operation, based on the read voltages that were used. FIG. 6 illustrates that estimated values of second, third, fourth, sixth and seventh read voltages R2, R3, R4, R6, and R7 may be represented as a function of the values of the first and fifth read voltages R1 and R5. Hereinafter, the read voltages used in a recent read operation for a memory block area denoted as used read voltages, and the remaining read voltages not used in the recent read operation are denoted as unused read voltages. That is, in the example of FIG. 6, used read voltages are the first and fifth read voltages R1 and R5, and unused read voltages are the second, third, fourth, sixth and seventh read voltages R2, R3, R4, R6, and R7.

According to various embodiments described with reference to FIGS. 7 to 10, the processor 134 may estimate values of unused read voltages based on values of used read voltages. When the processor 134 estimates the unused read voltages, the processor 134 may update the read voltage table 146 with the used read voltages and the estimated unused read voltages.

According to embodiments, the processor 134 may estimate values of unused read voltages based on values of used read voltages into which a recent voltage distribution of memory cells has been incorporated. Accordingly, the recent voltage distribution of the memory cells may also be incorporated into the unused read voltages. In particular, when a recent voltage distribution of memory cells is changed and thus values of used read voltages are changed due to a read retry performed by the memory device 150, the processor 134 may change values of unused read voltages in addition to the values of the used read voltages by incorporating the changed recent voltage distribution of the memory cells.

The processor 134 may control a subsequent read operation of the memory device 150 using a history read voltage set into which a recent voltage distribution of memory cells has been incorporated. As a result, the probability that the ECC component 138 will succeed in error correction decoding is high, because the information obtained by the ECC component 138 from the memory device 150 is more accurate. The processor 134 need only perform a small number of read retries. Accordingly, the reliability and performance of the memory system 110 may be improved.

Figure 7:
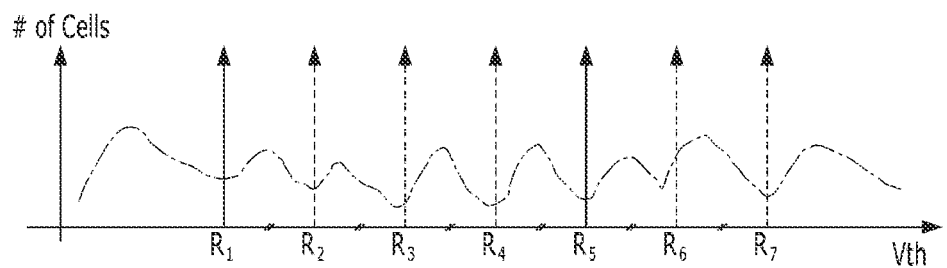
FIG. 7 is a diagram illustrating estimation of values of unused read voltages according to a first embodiment.

FIG. 7 is a diagram illustrating the estimation of values of unused read voltages according to a first embodiment.

In a graph illustrated in FIG. 7, the horizontal (i.e., x) axis indicates threshold voltages of memory cells, and the vertical (i.e., y) axis indicates the number of memory cells having corresponding threshold voltages. In FIG. 7, the curve (alternating long and short dashed lines) indicates a threshold voltage distribution of the memory cells, and solid line arrows indicate values of used read voltages. Furthermore, dotted line arrows indicate values of unused read voltages estimated according to the first embodiment.

In the example of FIG. 7, the processor 134 may estimate values of second, third, fourth, sixth and seventh read voltages R2, R3, R4, R6, and R7, that is, unused read voltages, based on values of first and fifth read voltages R1 and R5, that is, used read voltages. Specifically, the processor 134 may estimate the values of the unused read voltages so that the values of the first to seventh read voltages R1 to R7 are equally spaced apart, that is, the interval between adjacent read voltages is the same.

The processor 134 may update the read voltage table 146 with the values of the used read voltages and the estimated values of the unused read voltages.

Figure 8:
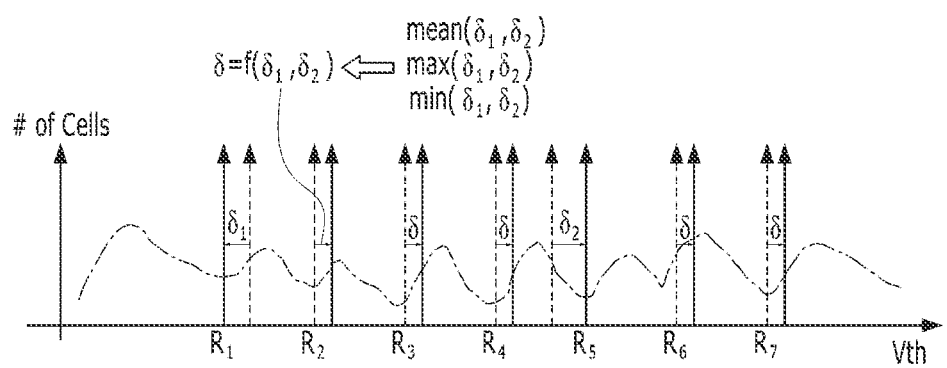
FIG. 8 is a diagram illustrating estimation of unused read voltages according to a second embodiment.

FIG. 8 is a diagram illustrating the estimation of unused read voltages according to a second embodiment.

In a graph illustrated in FIG. 8, the horizontal (i.e., x) axis indicates threshold voltages of memory cells, and the vertical (i.e., y) axis indicates the number of memory cells having corresponding threshold voltages. In FIG. 8, the curve (alternating long and short dashed lines) indicates a threshold voltage distribution of the memory cells, and dotted line arrows indicate previous read voltage values previously stored in the read voltage table 146. Furthermore, solid line arrows indicate recent read voltage values updated by a recent read operation. The recent read voltage values may include values of used read voltages in the recent read operation and values of unused read voltages estimated according to the second embodiment.

In the example of FIG. 8, the processor 134 may estimate values of second, third, fourth, sixth and seventh read voltages R2, R3, R4, R6, and R7, that is, unused read voltages, based on variances of values of first and fifth read voltages R1 and R5, that is, used read voltages.

The variance of a used read voltage may be determined as a difference between a value of a previously used read voltage and a value of the most recently used read voltage. In the example of FIG. 8, a first variance of the value of the first read voltage R1, that is, a used read voltage, is illustrated as $\delta 1$, and a second variance of the value of the fifth read voltage R5 is illustrated as $\delta 2$.

The processor 134 may estimate a value of an unused read voltage as a value changed from a previous value of the unused read voltage by an estimated variance $\delta$. The processor 134 may determine the estimated variance $\delta$ as a function of the first variance $\delta 1$ and the second variance $\delta 2$, i.e., $\delta = f(\delta 1, \delta 2)$. As a first example, the estimated variance $\delta$ may be determined as an average (mean) value of the first variance $\delta 1$ and the second variance $\delta 2$, i.e., $\delta = \text{mean}(\delta 1, \delta 2)$. As a second example, the estimated variance $\delta$ may be determined a maximum value of the first variance $\delta 1$ and the second variance $\delta 2$, i.e., $\delta = \max(\delta 1, \delta 2)$. As a third example, the estimated variance $\delta$ may be determined as a minimum value of the first variance $\delta 1$ and the second variance $\delta 2$, i.e., $\delta = \min(\delta 1, \delta 2)$. The function of the estimated variance $\delta$ is not limited to the first to third examples.

The processor 134 may update the read voltage table 146 with the values of the used read voltages and the estimated values of the unused read voltages.

Figure 9:
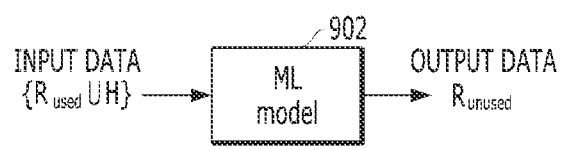
FIG. 9 is a diagram illustrating estimation of unused read voltages according to a third embodiment.

FIG. 9 is a diagram illustrating the estimation of unused read voltages according to a third embodiment.

The processor 134 may use a machine learning (ML) model 902 in order to estimate value of each of the unused read voltages. The ML model 902 may be previously generated using a supervised learning model. For example, in order to previously generate the ML model 902, a deep neural network may be used. The generated ML model 902 may be loaded into the memory 144 and driven by the processor 134.

Read voltages of a read voltage set and error correction information obtained by error correction decoding for data read using the read voltage values may be used as input and output data for the supervised learning.

For example, the input to the supervised learning may include a value $R_{used}$ of a used read voltage of the read voltage set and which is used in LSB page reading, and error correction information H. The output of the supervised learning may be a value $R_{unused}$ of an unused read voltage, that is, not used in LSB page reading.

The error correction information indicates how many errors are included in data of the memory device 150.

A first example of the error correction information may be a Hamming distance between ECC input data output by the memory device 150 and ECC output data whose error has been corrected by the ECC component 138. As the Hamming distance increases, a difference between the ECC input data and the ECC output data may also increase.

A second example of the error correction information may be the Hamming weight of an initial syndrome vector generated by the initial parity check for ECC input data output by the memory device 150. The ECC component 138 may perform the initial parity check on the ECC input data output by the memory device 150, and may determine whether an error is included in the ECC input data, based on the initial syndrome vector generated by the initial parity check. The ECC component 138 may perform error corrections based on whether an error is included in the ECC input data, and may repeat an operation of performing a subsequent parity check on the results of the error corrections until the error corrections are successful or a maximum number of iterations is reached. As the initial syndrome vector has a greater Hamming weight value, the reliability of data output by the memory device 150 may be low.

In some embodiments, the input data for the supervised learning may further include $\delta 1$ and $\delta 2$, that is, variances of values of used read voltages. The variance of the value of the used read voltage may be determined as a difference between a previous value of the used read voltage and a recent value of the used read voltage.

At operation S518 described with reference to FIG. 5, the estimation of an unused read voltage according to the third embodiment may be selectively performed.

Figure 10:
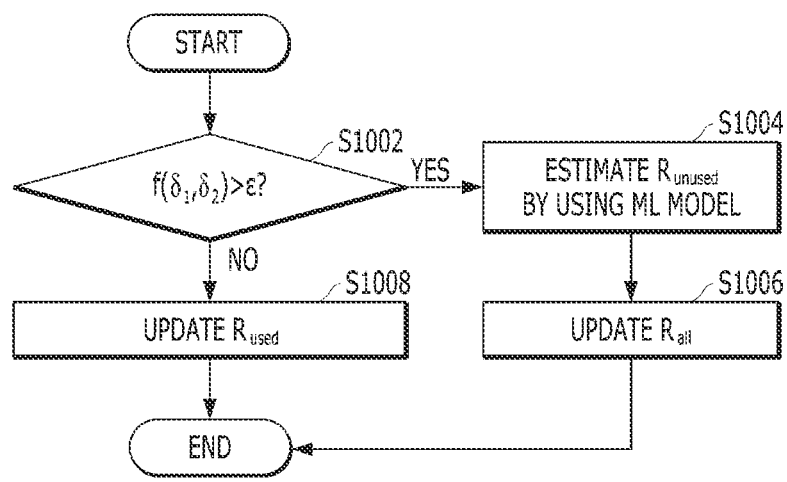
FIG. 10 is a diagram illustrating in detail an operation according to the third embodiment.

FIG. 10 is a diagram illustrating a detailed operation S518 according to the third embodiment.

Referring to FIG. 10, at operation S1002, the processor 134 may determine whether a value of a function of $\delta 1$ and $\delta 2$, that is, variances of values of used read voltages, exceeds a threshold value $\varepsilon$, $f(\delta 1, \delta 2) > \varepsilon$. The function may be an average of variances, a maximum of the variances, a minimum of the variances, or other suitable statistic of the variances.

When it is determined that the function value exceeds the threshold value ε ("YES" at S1002), at operation S1004, the processor 134 may estimate values of unused read voltages $R_{unused}$ by driving the ML model 902.

Input to the ML model 902 may include at least values of the used read voltages and error correction information depending on an implementation of the ML model 902, and may further include the variances of the values of the used read voltages. The error correction information may be obtained by the error correction decoding at operation S506. The output of the ML model 902 may include the estimated values of the unused read voltages.

At operation S1006, the processor 134 may update the read voltage table 146 with the values of the used read voltages and the estimated values $R_{all}$ of the unused read voltages.

When it is determined that the function value does not exceed the threshold value ε ("NO" at S1002), the processor 134 may determine that variances of the values of the unused read voltages are sufficiently small because variances of the values of the used read voltages are sufficiently small. Accordingly, at operation S1008, the processor 134 may update the read voltage table 146 with only the values of the used read voltages $R_{used}$.

According to embodiments, the processor 134 may control the memory device 150 to perform a read operation on a memory block using only some read voltages in a read voltage set. When the read operation is successfully completed, the processor 134 may estimate values of unused read voltages based on the values of the used read voltages. The processor 134 may update the used read voltages and estimated values of the remaining, unused read voltage values as history read voltage values of a corresponding memory block in the read voltage table 146.

In the example of the media scan operation, the processor 134 may control the memory device 150 to perform a read operation using only some read voltages so that the memory device 150 may improve the reliability of data already programmed into a memory block within a short time. Furthermore, the reliability of a subsequent read operation for the corresponding memory block may be improved because the processor 134 may update values of all of history read voltages of the corresponding memory block based on some read voltages by incorporating a recent threshold voltage distribution of memory cells. Accordingly, performance and reliability of the memory system 110 may be improved.

Embodiments of the present disclosure provide a controller capable of estimating values of unused read voltages of a read voltage set and updating the read voltage set with the estimated values, although a read operation is performed using values of only some read voltages of the read voltage set, and an operating method thereof.

Although various embodiments have been illustrated and described, it will be apparent to those skilled in the art from the present disclosure that various changes and modifications may be made without departing from the spirit and scope of the invention as defined in the following claims.

What is claimed is:

1. A controller for controlling a memory device comprising a plurality of multi-level cell memory blocks, the controller comprising:

a memory suitable for storing a plurality of read voltage sets, each having a plurality of read voltages for reading the multi-level cell memory blocks;

a processor suitable for controlling the memory device to perform a read operation on a target logical page using some of the plurality of read voltages in a selected read voltage set of the read voltage sets; and an error correction code (ECC) component suitable for determining whether the read operation is successful, by performing error detection and correction on data generated in the read operation and output from the memory device, wherein, when the read operation is determined to be successful, the processor updates the selected read voltage set with the read voltages used in the read operation when it is successful and estimated values of unused read voltages of the selected read voltage set, the estimated values being determined based on the used read voltages.

2. The controller of claim 1, wherein the processor changes values of the used read voltages when the read operation fails, and retries the read operation using the changed values of the used read voltages.

3. The controller of claim 1, wherein the processor selects the target logical page in response to trigger of a media scan operation, and performs a read reclaim operation on a memory block comprising the target logical page, based on a level of error of data output by the memory device when the read operation is successful.

4. The controller of claim 3, wherein the processor sequentially selects a target memory block from the plurality of multi-level cell memory blocks whenever the media scan operation is triggered, and selects the target logical page by selecting some of a plurality of logical pages associated with a vulnerable word line among word lines associated with the target memory block.

5. The controller of claim 1, wherein the processor estimating the values of the unused read voltages so that each adjacent pair of the used read voltages and the estimated values of the unused read voltages is spaced apart by the same interval.

6. The controller of claim 1, wherein the processor determines variances of the used read voltages based on the used read voltages of the selected read voltage set and the used read voltages when the read operation is successful, and determines the estimated values of the unused read voltages based on the determined variances and the unused read voltages of the selected read voltage set.

7. The controller of claim 1, wherein:

the processor further comprises a machine learning model configured to perform supervised-learning based on select read voltages of the plurality of read voltage sets and error correction information of data read using the select read voltages, and the machine learning model outputs the estimated values of the unused read voltages using, as input data, the used read voltages when the read operation is successful and error correction information of data read by the read operation.

8. The controller of claim 7, wherein the error correction information comprises a Hamming distance between data input to the ECC component from the memory device and error-corrected data output by the ECC component and a Hamming weight of an initial syndrome vector generated by an initial parity check of the data input to the ECC component.

9. The controller of claim 7, wherein the processor
determines variances of the used read voltages based on the used read voltages of the selected read voltage set and the used read voltages when the read operation is successful,
determines each of the estimated values of the unused read voltages using the machine learning model when the variance exceeds a threshold value, and
determines each of the estimated values of the unused read voltages to be the same as the corresponding unused read voltage of the selected read voltage set when the variance does not exceed the threshold value.

10. The controller of claim 1, wherein the read voltage sets stored in the memory comprise at least one history read voltage set for each memory block.

11. An operating method of a controller controlling a memory device comprising a plurality of multi-level cell memory blocks, the operating method comprising:
controlling the memory device to perform a read operation on a target logical page using some of a plurality of read voltages in a selected read voltage set of a plurality of read voltage sets stored in a memory of the controller, each of the read voltage sets having multiple read voltages for reading the multi-level cell memory blocks;
determining whether the read operation is successful, by performing error detection and correction on data output from the memory device by the read operation; and
updating the selected read voltage set with the read voltages used in the read operation when it is successful and estimated values of unused read voltages of the selected read voltage set, the estimated values being determined based on the used read voltages.

12. The operating method of claim 11, further comprising:
changing values of the used read voltages when the read operation fails, and
retrying the read operation using the changed values of the used read voltages.

13. The operating method of claim 11, further comprising:
selecting the target logical page in response to trigger of a media scan operation; and
performing a read reclaim operation on a memory block comprising the target logical page, based on a level of error of data output by the memory device when the read operation is successful.

14. The operating method of claim 11, further comprising estimating the values of the unused read voltages so that each adjacent pair of the used read voltages and the estimated values of the unused read voltages is spaced apart by the same interval.

15. The operating method of claim 11, further comprising:
determining variances of the used read voltages based on the used read voltages of the selected read voltage set and the used read voltages when the read operation is successful, and
determining the estimated values of the unused read voltages based on the determined variances and the unused read voltages of the selected read voltage set.

16. The operating method of claim 11, further comprising estimating the values of the unused read voltages by inputting, to a machine learning model, the used read voltages when the read operation is successful and error correction information of data read by the read operation,
wherein the machine learning model is previously performs supervised-learning based on select read voltages of a plurality of read voltage sets and error correction information of data read using the select read voltages.

17. The operating method of claim 16, wherein the error correction information comprises a Hamming distance between data input to the ECC component and which is output from the memory device and on which the error correction and detection has not been performed and data on which the error correction and detection has been performed and a Hamming weight of an initial syndrome vector generated by an initial parity check of the data input to the ECC component.

18. The operating method of claim 11, further comprising:
determining variances of the used read voltages based on the used read voltages of the selected read voltage set and the used read voltages when the read operation is successful; and
determining each of the estimated values of the unused read voltages by inputting, to a machine learning model, the used read voltages when the read operation is successful when the variance exceeds a threshold value and error correction information of data read by the read operation, and determining each of the estimated values of the unused read voltages to be the same as the corresponding unused read voltage of the selected read voltage set when the variance does not exceed the threshold value,
wherein the machine learning model is previously performs supervised-learning based on select read voltages of a plurality of read voltage sets and error correction information of data read using the select read voltages.

19. The operating method of claim 11, wherein the read voltage sets stored in the memory comprise at least one history read voltage set for each memory block.

20. A memory system comprising:
a memory device including a plurality of memory blocks; and
a controller configured to:
control the memory device to perform a read operation on a target logical page using select read voltages in a target read voltage set including the select read voltages and remaining read voltages;
determine whether the read operation is successful;
when it is determined that the read operation was successful, change a value of each of the remaining read voltages, based on a difference between previous and current values of each of the select read voltages; and
update the target read voltage set such that the select read voltages have the current values and the remaining read voltages have changed values.

* * * * *